(12) United States Patent
Kim et al.

(10) Patent No.: US 11,264,599 B2
(45) Date of Patent: Mar. 1, 2022

(54) ELECTRODE PERFORMANCE EVALUATION SYSTEM AND ELECTRODE PERFORMANCE EVALUATION METHOD

(71) Applicant: LG CHEM, LTD., Seoul (KR)

(72) Inventors: Hyo-Sik Kim, Daejeon (KR); Hye-Bin Kim, Daejeon (KR); Sol-Nip Lee, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 385 days.

(21) Appl. No.: 16/604,536

(22) PCT Filed: Oct. 23, 2018

(86) PCT No.: PCT/KR2018/012583
§ 371 (c)(1),
(2) Date: Oct. 10, 2019

(87) PCT Pub. No.: WO2019/093687
PCT Pub. Date: May 16, 2019

(65) Prior Publication Data
US 2020/0185697 A1    Jun. 11, 2020

(30) Foreign Application Priority Data

Nov. 9, 2017 (KR) .......... 10-2017-0148954

(51) Int. Cl.
*H01M 4/04* (2006.01)
*G01N 27/06* (2006.01)
(Continued)

(52) U.S. Cl.
CPC ............ *H01M 4/0404* (2013.01); *B64G 1/56* (2013.01); *G01F 1/68* (2013.01); *G01L 19/0007* (2013.01);
(Continued)

(58) Field of Classification Search
CPC .... H01M 4/0404; H01M 50/46; H01M 4/621; G01N 27/06; G01N 27/12; B64G 1/56;
(Continued)

(56) References Cited

U.S. PATENT DOCUMENTS 9,046,463 B1 * 6/2015 Adler ................ G01N 27/02
2004/0086633 A1   5/2004 Lemmon et al.
(Continued)

FOREIGN PATENT DOCUMENTS

CN          1505193 A     6/2004
CN        101467031 A     6/2009
(Continued)

OTHER PUBLICATIONS

Johannes Landesfeind et al, Journal of The Electrochemical Society, Tortuosity of Battery Electrodes: Validation of Impedance-Derived Values and Critical Comparison with 3D Tomography, Journal of the Electrochemical Society, 165 (3) A469-A476, 2018 (Year: 2018).*

(Continued)

*Primary Examiner* — Clayton E. LaBalle
*Assistant Examiner* — Kevin C Butler
(74) *Attorney, Agent, or Firm* — Birch, Stewart, Kolasch & Birch, LLP

(57) ABSTRACT

An electrode performance evaluation system and an electrode performance evaluation method is disclosed. The method includes acquiring impedance measurement data for different frequencies by applying an alternating current signal to an electrode assembly including an electrode which is immersed in an electrolyte solution, calculating impedance calculation data for different frequencies while changing the frequency of an impedance equation corresponding to a circuit model of the electrode assembly, calculating the resistance value of ion bulk resistance in the electrolyte (Continued)

solution using the ion conductivity of the electrolyte solution, the area of the electrode and the thickness and porosity of an active material layer of the electrode, and determining effective tortuosity as a factor of the electrode performance based on the impedance measurement data for different frequencies, the impedance calculation data for different frequencies and the resistance value of the ion bulk resistance.

12 Claims, 4 Drawing Sheets

(51) Int. Cl.

| | |
|---|---|
| H01M 4/62 | (2006.01) |
| H01M 50/46 | (2021.01) |
| G01N 27/12 | (2006.01) |
| B64G 1/56 | (2006.01) |
| G01F 1/68 | (2006.01) |
| G01M 9/06 | (2006.01) |
| G01R 31/08 | (2020.01) |
| G01L 19/00 | (2006.01) |
| H01M 4/02 | (2006.01) |

(52) U.S. Cl.
CPC ............ *G01M 9/065* (2013.01); *G01N 27/06* (2013.01); *G01N 27/12* (2013.01); *G01R 31/08* (2013.01); *H01M 4/621* (2013.01); *H01M 50/46* (2021.01); *H01M 2004/021* (2013.01)

(58) Field of Classification Search
CPC ...... G01L 19/0007; G01F 1/68; G01M 9/065; G01R 31/08
USPC ........................................................ 73/432.1
See application file for complete search history.

(56) References Cited

U.S. PATENT DOCUMENTS

| | | | |
|---|---|---|---|
| 2009/0157338 A1 | 6/2009 | Wang | |
| 2010/0204936 A1 | 8/2010 | Hansson et al. | |
| 2011/0301931 A1* | 12/2011 | Gering | G01R 31/392 703/13 |
| 2013/0196223 A1* | 8/2013 | Gering | H01M 4/608 429/188 |
| 2013/0207671 A1 | 8/2013 | Torai et al. | |
| 2014/0030608 A1* | 1/2014 | l'Abee | H01M 50/411 429/326 |
| 2014/0167329 A1* | 6/2014 | L'Abee | H01M 50/44 264/465 |
| 2014/0287287 A1 | 9/2014 | Osaka et al. | |
| 2015/0377828 A1 | 12/2015 | Carpenter et al. | |
| 2015/0380953 A1 | 12/2015 | Keates et al. | |
| 2016/0103184 A1 | 4/2016 | Kawai et al. | |
| 2016/0259011 A1 | 9/2016 | Joe | |
| 2017/0110259 A1* | 4/2017 | Mitlin | H01G 11/06 |
| 2017/0306748 A1* | 10/2017 | Marland | E21B 44/005 |
| 2017/0373284 A1* | 12/2017 | Durstock | H01M 4/525 |
| 2018/0019483 A1* | 1/2018 | Pezeshki | H01M 8/20 |
| 2018/0043656 A1* | 2/2018 | Song | H01G 9/02 |
| 2018/0097396 A1* | 4/2018 | Qi | G01R 31/396 |
| 2019/0319270 A1* | 10/2019 | Belcher | H01M 4/621 |
| 2020/0112050 A1* | 4/2020 | Hu | H01B 1/08 |
| 2020/0119364 A1* | 4/2020 | Miller | H01M 4/8647 |
| 2020/0185697 A1* | 6/2020 | Kim | H01M 10/4285 |
| 2020/0243870 A1* | 7/2020 | Wachsman | H01M 4/80 |
| 2021/0083320 A1* | 3/2021 | Wachsman | C04B 35/6264 |
| 2021/0126320 A1* | 4/2021 | Pan | H01M 50/403 |
| 2021/0257658 A1* | 8/2021 | Wachsman | H01M 4/134 |
| 2021/0313583 A1* | 10/2021 | Wang | H01M 4/382 |
| 2021/0351401 A1* | 11/2021 | Liu | H01M 4/583 |
| 2021/0376310 A1* | 12/2021 | Dasgupta | H01M 4/0404 |

FOREIGN PATENT DOCUMENTS

| | | |
|---|---|---|
| CN | 106047678 A | 10/2016 |
| JP | 2010-46785 A | 3/2010 |
| JP | 2015-37008 A | 2/2015 |
| JP | 2015-41434 A | 3/2015 |
| JP | 2015-72875 A | 4/2015 |
| JP | 5849537 B2 | 1/2016 |
| KR | 10-2011-0119779 A | 11/2011 |
| KR | 10-2013-0092461 A | 8/2013 |
| KR | 10-1708885 B1 | 2/2017 |
| KR | 10-1725514 B1 | 4/2017 |
| KR | 10-2017-0107738 A | 9/2017 |

OTHER PUBLICATIONS

Simon Malifarge et al., Determination of Tortuosity Using Impedance Spectra Analysis of Symmetric Cell, Journal of The Electrochemical Society, 164 (11) E3329-E3334, 2017 (Year: 2017).*

Vishwas Goel et al., Simulation of the Electrochemical Impedance in a Three-Dimensional, Complex Microstructure of Solid Oxide Fuel Cell Cathode and Its Application in the Microstructure Characterization, Frontiers in Chemistry, May 27, 2021, 14 pages (Year: 2021).*

Pooja Vadhva et al., Electrochemical Impendence Spectroscopy for All-Solid-State Batteries: Theory, Methods and Future Outlook, ChemElectroChemReviewsdoi.org/10.1002/celc.202100108, Chemistry Europe, 18 pages, 2021 (Year: 2021).*

Extended Search Report dated Aug. 3, 2020 corresponding EP Patent Application No. 18877218.0.

International Search Report for PCT/KR2018/012583 (PCT/ISA/210) dated Jan. 24, 2019.

Landesfeind et al., "Tortuosity Determination of Battery Electrodes and Separators by Impedance Spectroscopy", Journal of The Electrochemical Society, 163 (7), pp. A1373-A1387. (2016).

* cited by examiner

ELECTRODE PERFORMANCE EVALUATION SYSTEM AND ELECTRODE PERFORMANCE EVALUATION METHOD

TECHNICAL FIELD

The present disclosure relates to an electrode performance evaluation system and an electrode performance evaluation method that can be used for electrochemical devices such as a lithium secondary battery, etc., more particularly to a system and a method for evaluating electrode performance using an impedance of an electrode assembly.

The present application claims priority to Korean Patent Application No. 10-2017-0148954 filed on Nov. 9, 2017 in the Republic of Korea, the disclosures of which are incorporated herein by reference.

BACKGROUND ART

Recently, interests in energy storage technologies are increasing. As the applications are expanded to mobile phones, portable cameras, notebook PCs and electric vehicles, efforts for research and development of electrochemical devices are becoming embodied gradually.

Electrochemical devices are drawing a lot of attentions in this aspect. In particular, the development of rechargeable secondary batteries is a hot topic. Recently, research and development of new electrode and battery design are being carried out actively to improve capacity density and specific energy for the development of secondary batteries.

Among the currently used secondary batteries, the lithium secondary batteries developed in the early 1990s are receiving a lot of attentions because of the advantages of high operation voltage and remarkably high energy density as compared to the conventional batteries using aqueous electrolyte solutions such as Ni-MH, Ni—Cd and sulfuric acid-lead batteries.

The electrode used in the lithium secondary battery has a porous active material layer on the surface because lithium ion has to be transported to the whole surface of the electrode through an electrolyte solution. The electrolyte solution is filled in the pores of the active material layer. The performance of the lithium secondary battery can be improved when lithium ion is absorbed into or released from the active material layer through the pores with high speed. Therefore, it is very important to quantitatively evaluate the transport characteristics of lithium ion through the pores.

Formerly, the pore characteristics of the electrode were evaluated based on the analysis of porosity, pore size, etc. (PSD; pore size distribution). However, this evaluation method merely provides morphological information such as the pore volume, size, etc. of the electrode and does not provide information about the transport characteristics of lithium ion in the electrolyte solution, which actually affect the battery performance. Therefore, a method for evaluating the lithium ion transport characteristics of the electrode itself during the fabrication process of the electrode and detecting a defective electrode in advance is necessary.

Also, in terms of economy, a screening method capable of checking the defect of the electrode itself before first charge-discharge, i.e. activation, is necessary.

DISCLOSURE

Technical Problem

The present disclosure is designed to solve the problems of the related art, and therefore the present disclosure is directed to providing an electrode performance evaluation system and an electrode performance evaluation method capable of evaluating the performance of an electrode itself before first charge-discharge, i.e. activation.

However, the technical problem to be solved by the present disclosure is not limited to that described above and other unmentioned problems will be clearly understood by those skilled in the art from the following description.

Technical Solution

In one aspect of the present disclosure, there is provided an electrode performance evaluation method according to the following exemplary embodiments.

A first exemplary embodiment relates to an electrode performance evaluation method, including:

(a) a step of mounting an electrode assembly including an electrode wherein an active material layer is coated on a current collector between holders of an impedance measurement device, immersing the electrode assembly in an electrolyte solution and applying an alternating current signal to the electrode assembly under a plurality of frequency conditions;

(b) a step of acquiring impedance measurement data for different frequencies measured by the impedance measurement device by electrochemical impedance spectroscopy while the alternating current signal is applied to the electrode assembly from the impedance measurement device;

(c) a step of determining, from a circuit model including an inductor, a first resistor serially connected to the inductor, a second resistor serially connected to the first resistor, a TLM impedance serially connected to the second resistor and including a first RC circuit wherein a third resistor and a third capacitor are connected in parallel, a second RC circuit parallelly connected to the TLM impedance, wherein a fourth resistor and a first capacitor are connected in parallel, and a second capacitor parallelly connected to the second resistor and the TLM impedance, as a circuit model corresponding to the electrode assembly, an impedance equation including the inductance value of the inductor, the resistance values of the first to fourth resistors, the capacitance values of the first and second capacitors and the time constant of the first RC circuit as fitting parameters and including frequency as an input parameter;

(d) a step of determining the fitting parameters including the resistance values of the first to third resistors and the time constant of the first RC circuit such that the difference between the impedance calculation data for different frequencies calculated by changing the frequency in the impedance equation and the impedance measurement data for different frequencies is minimized;

(e) a step of calculating the resistance value of ion bulk resistance in the electrolyte solution using the ion conductivity of the electrolyte solution, the area of the electrode and the thickness and porosity of the active material layer of the electrode;

(f) a step of determining effective tortuosity which is a ratio of the resistance value of the third resistor to the resistance value of the ion bulk resistance; and (g) generating a performance evaluation result for the electrode and identifying the electrode as a defective electrode if the electrode fails to meet predetermined criteria.

A second exemplary embodiment relates to the electrode performance evaluation method according to the first exemplary embodiment, wherein the impedance equation determined in the step (c) is expressed by Equation 1:

$$Z(f) = Z_L + Z_{R_1} + \frac{1}{\left(\frac{1}{Z_{R_2}} + \frac{1}{Z_{Q_2}}\right)} + \frac{1}{\left(\frac{1}{Z_{R_1}} + \frac{1}{Z_{Q_1}} + \frac{1}{Z_{TLM}}\right)} \quad \text{[Equation 1]}$$

$$\left(Z_L = i \cdot 2\pi f L, \, Z_{R_1} = R_1 Z_{R_2} = R_2,\right.$$

$$Z_{Q_2} = \frac{1}{(i \cdot 2\pi f)^{a_2} C_2}, \, Z_{R_4} = R_4,$$

$$\left. Z_{Q_1} = \frac{1}{(i \cdot 2\pi f)^{a_1} C_1}, \, Z_{TLM} = R_3 \frac{\coth(i \cdot 2\pi f \tau)^{\alpha/2}}{(i \cdot 2\pi f \tau)^{\alpha/2}}\right)$$

wherein Z(f) is the impedance of the electrode assembly, i is the imaginary unit, f is the frequency, L is the inductance value of the inductor, $R_1$ is the resistance value of the first resistor, $R_2$ is the resistance value of the second resistor, $R_3$ is the resistance value of the third resistor, $R_4$ is the resistance value of the fourth resistor, $C_1$ is the capacitance value of the first capacitor, $C_2$ is the capacitance value of the second capacitor, $a_1$ is a calibration constant for the first capacitor, $a_2$ is a calibration constant for the second capacitor, τ is the time constant of the first RC circuit and α is a calibration constant for the third capacitor.

A third exemplary embodiment relates to the electrode performance evaluation method according to the first exemplary embodiment or the second exemplary embodiment, wherein, in the step (e), the resistance value of the ion bulk resistance is calculated using Equation 2:

$$R_{Li\_bulk} = \frac{1}{k} \cdot \frac{L}{A} \quad \text{[Equation 2]}$$

wherein $R_{Li\_bulk}$ is the ion bulk resistance, k is the ion conductivity of the electrolyte solution, L is the thickness of the active material layer of the electrode and A is the area of the electrode multiplied by the porosity of the active material layer of the electrode.

A fourth exemplary embodiment relates to the electrode performance evaluation method according to any of the first to third exemplary embodiments, which further includes:

(g1) a step of generating a performance evaluation result for the electrode by comparing the effective tortuosity with a preset reference value and displaying the performance evaluation result through a display.

A fifth exemplary embodiment relates to the electrode performance evaluation method according to any of the first to fourth exemplary embodiments, which further includes:

(g2) a step of generating a performance evaluation result for the electrode by comparing the resistance value of the second resistor with a preset reference value and displaying the performance evaluation result through a display.

In another aspect of the present disclosure, there is provided an electrode performance evaluation system according to the following exemplary embodiments.

A sixth exemplary embodiment relates to an electrode performance evaluation system including:

an impedance acquisition unit configured to acquire impedance measurement data for different frequencies measured for an electrode assembly including an electrode by electrochemical impedance spectroscopy;

an equation determination unit configured to determine, using a circuit model including an inductor, a first resistor serially connected to the inductor, a second resistor serially connected to the first resistor, a TLM impedance serially connected to the second resistor and including a first RC circuit wherein a third resistor and a third capacitor are connected in parallel, a second RC circuit parallelly connected to the TLM impedance, wherein a fourth resistor and a first capacitor are connected in parallel, and a second capacitor parallelly connected to the second resistor and the TLM impedance, as a circuit model corresponding to the electrode assembly, an impedance equation including the inductance value of the inductor, the resistance values of the first to fourth resistors, the capacitance values of the first and second capacitors and the time constant of the first RC circuit as fitting parameters and including frequency as an input parameter;

a first calculation unit configured to determine the fitting parameters including the resistance values of the first to third resistors and the time constant of the first RC circuit such that the difference between the impedance calculation data for different frequencies calculated by changing the frequency in the impedance equation and the impedance measurement data for different frequencies is minimized;

a second calculation unit configured to calculate the resistance value of ion bulk resistance in the electrolyte solution using the ion conductivity of the electrolyte solution, the area of the electrode and the thickness and porosity of the active material layer of the electrode; and a third calculation unit configured to determine effective tortuosity which is a ratio of the resistance value of the third resistor to the resistance value of the ion bulk resistance.

A seventh exemplary embodiment relates to the electrode performance evaluation system according to the sixth exemplary embodiment, wherein the equation determination unit is configured to determine the impedance equation expressed by Equation 1:

$$Z(f) = Z_L + Z_{R_1} + \frac{1}{\left(\frac{1}{Z_{R_2}} + \frac{1}{Z_{Q_2}}\right)} + \frac{1}{\left(\frac{1}{Z_{R_1}} + \frac{1}{Z_{Q_1}} + \frac{1}{Z_{TLM}}\right)} \quad \text{[Equation 1]}$$

$$\left(Z_L = i \cdot 2\pi f L, \, Z_{R_1} = R_1 Z_{R_2} = R_2,\right.$$

$$Z_{Q_2} = \frac{1}{(i \cdot 2\pi f)^{a_2} C_2}, \, Z_{R_4} = R_4,$$

$$\left. Z_{Q_1} = \frac{1}{(i \cdot 2\pi f)^{a_1} C_1}, \, Z_{TLM} = R_3 \frac{\coth(i \cdot 2\pi f \tau)^{\alpha/2}}{(i \cdot 2\pi f \tau)^{\alpha/2}}\right)$$

wherein Z(f) is the impedance of the electrode assembly, i is the imaginary unit, f is the frequency, L is the inductance value of the inductor, $R_1$ is the resistance value of the first resistor, $R_2$ is the resistance value of the second resistor, $R_3$ is the resistance value of the third resistor, $R_4$ is the resistance value of the fourth resistor, $C_1$ is the capacitance value of the first capacitor, $C_2$ is the capacitance value of the second capacitor, $a_1$ is a calibration constant for the first capacitor, $a_2$ is a calibration constant for the second capacitor, τ is the time constant of the first RC circuit and α is a calibration constant for the third capacitor.

An eighth exemplary embodiment relates to the electrode performance evaluation system according to the sixth exemplary embodiment or the seventh exemplary embodiment, wherein the second calculation unit is configured to calculate the resistance value of the ion bulk resistance using Equation 2:

$$R_{Li\_bulk} = \frac{1}{k} \cdot \frac{L}{A} \qquad \text{[Equation 2]}$$

wherein $R_{Li\_bulk}$ is the ion bulk resistance. k is the ion conductivity of the electrolyte solution, L is the thickness of the active material layer of the electrode and A is the area of the electrode multiplied by the porosity of the active material layer of the electrode.

A ninth exemplary embodiment relates to the electrode performance evaluation system according to any of the sixth to eighth exemplary embodiments, which further includes a determination unit configured to generate a performance evaluation result for the electrode by comparing the effective tortuosity with a preset reference value and display the performance evaluation result through a display.

A tenth exemplary embodiment relates to the electrode performance evaluation system according to any of the sixth to ninth exemplary embodiments, which further includes a determination unit configured to generate a performance evaluation result for the electrode by comparing the resistance value of the second resistor with a preset reference value and display the performance evaluation result through a display.

Advantageous Effects

According to the present disclosure, electrode performance can be evaluated by quantitatively calculating resistance during diffusion of lithium ion in an electrode from a separator to a current collector through impedance fitting using a circuit model for an electrode assembly before conducting first charge-discharge.

Also, according to the present disclosure, contact resistance performance between an active material layer and a current collector of an electrode can be evaluated by quantitatively calculating the resistance across the interface between active material layer and the current collector through the impedance fitting.

According to the electrode performance evaluation method, the performance of a battery may be comparatively analyzed in advance. Through this, the cost of battery production may be reduced by screening out a defective electrode from the production process.

This electrode performance evaluation method is applicable not only to single positive or negative electrodes but also to pairs of positive/negative electrodes.

BEST MODE

Hereinafter, the present disclosure is described in detail with reference to the accompanying drawings. It should be understood that the terms used in the specification and the appended claims should not be construed as limited to general or dictionary meanings, but interpreted based on the meanings and concepts corresponding to the technical aspects of the present disclosure on the basis of the principle that an inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

Figure 1:
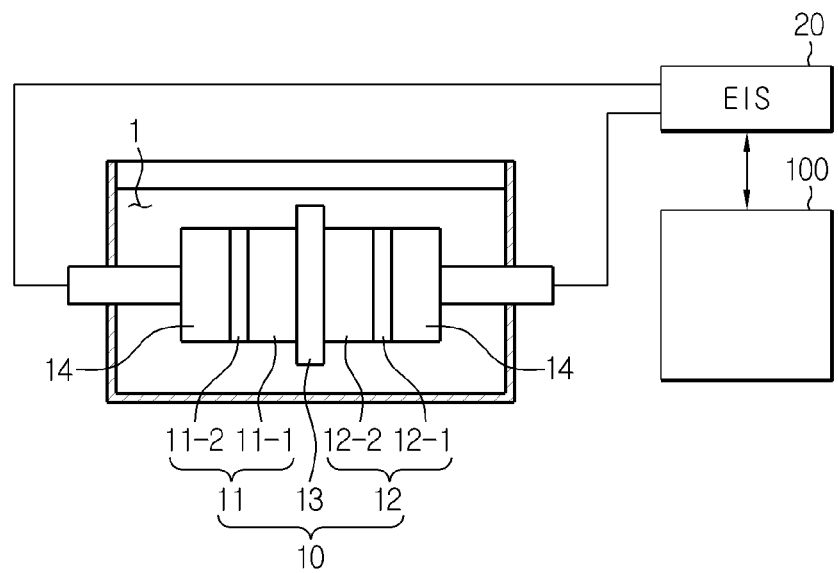
FIG. 1 shows the configuration of an electrode performance evaluation system including an electrode performance evaluation device according to an exemplary embodiment of the present disclosure.

FIG. 1 shows the configuration of an electrode performance evaluation system including an electrode performance evaluation device according to an exemplary embodiment of the present disclosure.

Referring to FIG. 1, the electrode performance evaluation system includes an electrode assembly 10, an impedance measurement device 20 and an electrode performance evaluation device 100.

Referring to FIG. 1, the electrode assembly 10 includes an electrode used in an electrochemical device. The electrode assembly 10 is an object to be inspected by the electrode performance evaluation system and is assumed to be in a state prior to first charge-discharge.

More specifically, the electrode assembly 10 includes a first electrode 11, a second electrode 12 and a separator 13. The first electrode 11 includes a first current collector 11-2 and an active material layer 11-1 formed on the first current collector 11-2. The second electrode 12 includes a second current collector 12-1 and an active material layer 12-2 formed on the second current collector 12-1. In this case, the first electrode 11 and the second electrode 12 may have the same or different polarity. When the first electrode 11 and the second electrode 12 have the same polarity, the active material layer coated on each electrode is identical. If the first electrode 11 and the second electrode 12 have different polarities, the active material layer coated on each electrode is different. A reference electrode (not shown) may be optionally connected to the separator 13.

The electrode assembly 10 described below is assumed to have the configuration shown in FIG. 1 and it is assumed that the first electrode 11 and the second electrode 12 have the same polarity.

The impedance measurement device 20 measures the impedance of the electrode assembly 10 by inputting alternating current signals of various frequencies to the electrode assembly 10. For example, the impedance measurement device 20 measures, while sequentially applying alternating current signals corresponding to a plurality of preset frequency conditions between the first electrode 11 and the second electrode 12 of the electrode assembly 10 through a pair of holders 14, alternating voltage signals from the electrode assembly 10 through the holders 14. Then, the impedance measurement device 20 can measure the impedance of the electrode assembly 10 for different frequencies by electrochemical impedance spectroscopy (EIS) based on the alternating voltage signals measured while the alternating current signals are applied. The amplitude of the alternating current signal, i.e., the magnitude of alternating current, is set appropriately in consideration of the magnitude of the charge-discharge current of a battery. For example, the magnitude of the alternating current may be controlled in a range from 1 μA to 1 A.

Specifically, the impedance measurement device 20 is connected to the electrode performance evaluation device 100 through a communications cable. The impedance measurement device 20 outputs the impedance measurement data for different frequencies measured for the electrode assembly 10 to the electrode performance evaluation device 100 through the communications cable. The communications cable may be connected to an input/output (I/O) interface of the electrode performance evaluation device 100.

The frequency of the alternating current signal inputted from the impedance measurement device 20 to the electrode assembly 10 may be varied by user setting. Specifically, the frequency of the alternating current may be varied by tens to hundreds of points in a range from 1 mHz to 1 GHz.

The impedance measurement data for different frequencies include real parts and imaginary parts. The impedance measurement data for different frequencies outputted by the impedance measurement device 20 may be represented as a profile-type graph as shown in FIG. 5 and FIG. 6.

Figure 5:
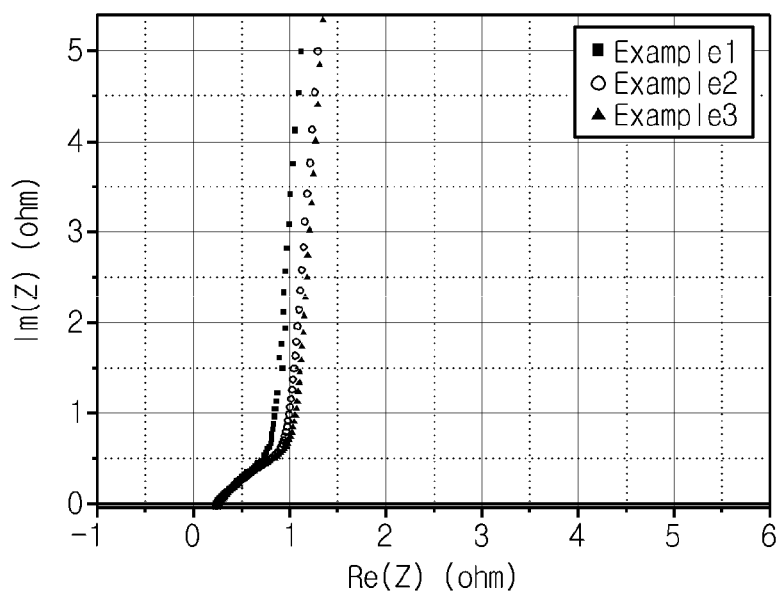
FIG. 5 shows a result of plotting the impedance measurement data for different frequencies acquired for the electrode assemblies prepared in Examples 1-3.
Figure 6:
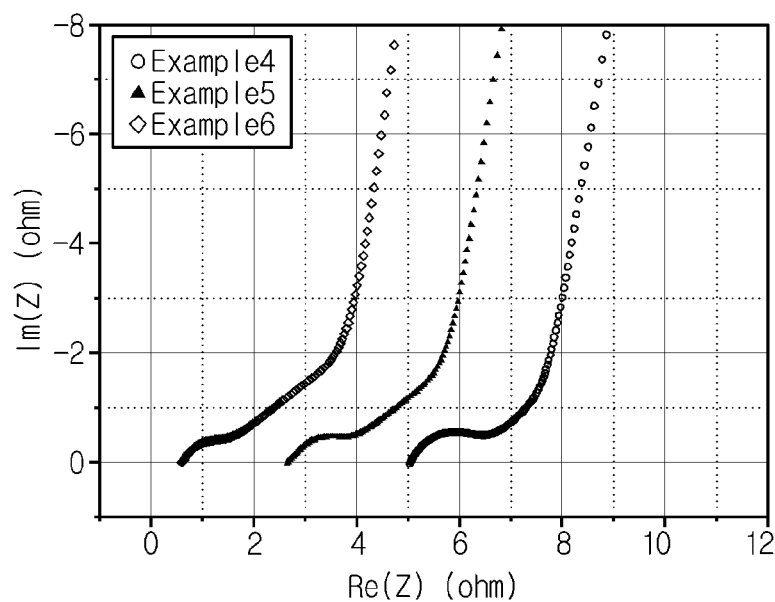
FIG. 6 shows a result of plotting the impedance measurement data for different frequencies acquired for the electrode assemblies prepared in Examples 4-6.

In FIG. 5 and FIG. 6, the x-coordinate of the plotted dots correspond to the real parts of the impedance measurement data and the y-coordinate of the plotted dots correspond to the imaginary parts of the impedance measurement data.

FIG. 5 and FIG. 6 show the profiles of three impedance measurement data. The profiles of the impedance measurement data was measured for the electrode assemblies fabricated with different specifications. The electrode assemblies may have different pore structures due to the difference in the content of a conductive material included in the active material layer or the process condition during the coating of the active material layer.

The electrode performance evaluation device 100 acquires the impedance measurement data for different frequencies measured for the electrode assembly 10 from the impedance measurement device 20. The electrode performance evaluation device 100 evaluates the electrode performance by calculating effective tortuosity using an impedance equation based on the acquired impedance measurement data for different frequencies. The concept and calculation procedure of the effective tortuosity are described in detail later.

The electrode performance evaluation device 100 can screen out a defective electrode by evaluating the performance of the electrode assembly 10 including the electrode prior to first charge-discharge. Through this, the cost of battery production may be reduced by screening out a defective electrode from the production process.

Hereinafter, the electrode performance evaluation system and an electrode performance evaluation method are described in more detail referring to FIG. 2 and FIG. 3.

Figure 2:
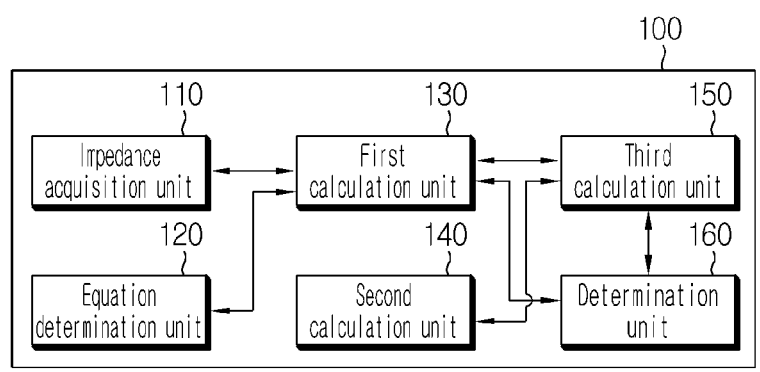
FIG. 2 shows the configuration of an electrode performance evaluation device according to an exemplary embodiment of the present disclosure.

FIG. 2 shows the configuration of the electrode performance evaluation device according to an exemplary embodiment of the present disclosure.

Referring to FIG. 2, the electrode performance evaluation device 100 according to an exemplary embodiment of the present disclosure includes an impedance acquisition unit 110, an equation determination unit 120, a first calculation unit 130, a second calculation unit 140 and a third calculation unit 150.

The impedance acquisition unit 110 acquires impedance measurement data for different frequencies for the electrode assembly 10 measured under a plurality of frequency conditions from the impedance measurement device 20 through a communications cable.

The impedance measurement data for different frequencies are measured by electrochemical impedance spectroscopy (EIS). A detailed description is omitted because the impedance measurement by EIS is well known in the art.

The impedance acquisition unit 110 is connected to the external impedance measurement device 20 through communications cable through an input/output (I/O) interface and receives the frequency of the alternating current signal used to measure the impedance and the impedance measurement data of the electrode assembly 10 measured at the frequency from the impedance measurement device 20. The impedance measurement data for different frequencies vary depending on the kinds of the active material layer and the current collector constituting the electrode, the content of the conductive material, etc. The impedance acquisition unit 110 stores the impedance measurement data for different frequencies acquired from the impedance measurement device 20 through the input/output interface in a memory (not shown) and outputs the same to the first calculation unit 130.

The equation determination unit 120 determines an impedance equation using a circuit model preset for the electrode assembly 10. The circuit model may represent an equivalent circuit capable of approximately simulating an alternating voltage signal measured by a pair of holders 14 provided on both sides of the electrode assembly 10 when an alternating current signal is applied to the electrode assembly 10.

The circuit model includes a plurality of circuit elements so as to output an alternating voltage signal when an alternating current signal is applied. The plurality of the circuit elements are not specially limited. Specifically, they include one or more circuit element selected from a group consisting of resistors (R), inductors (L) and capacitors (C).

The circuit elements included in the circuit model may be connected with each other either serially or parallelly, so as to output the alternating voltage signal measured by the two holders 14 of the impedance measurement device 20 electrically connected to the both ends of the electrode assembly 10 or an alternating voltage signal similar thereto when an alternating current signal is applied to the electrode assembly 10.

Specifically, the serial or parallel connection of the circuit elements may be determined through trial and error method. And, when the circuit model includes a plurality of circuit elements, the resistor, inductor or capacitor may be included in plural numbers.

Figure 4:
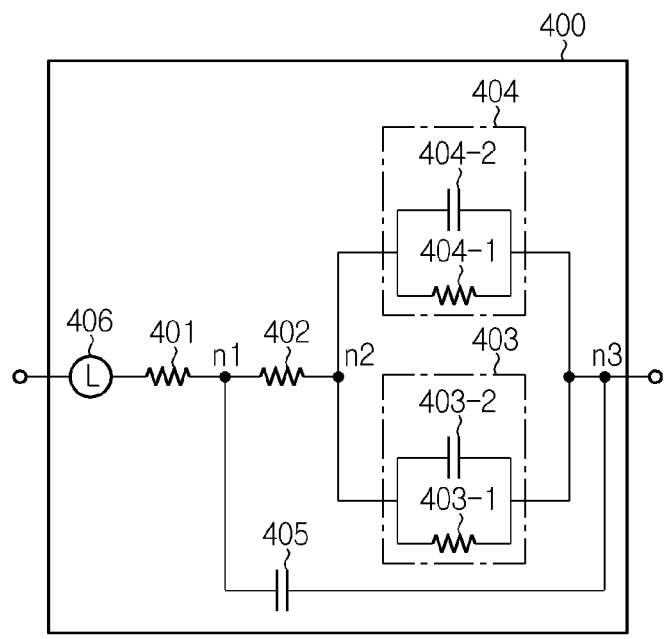
FIG. 4 shows the circuit diagram of a circuit (equivalent circuit) model for an electrode assembly according to a specific exemplary embodiment.

FIG. 4 shows an exemplary circuit diagram of a circuit model for the electrode assembly 10.

Referring to FIG. 4, the circuit model 400 of the electrode assembly 10 includes a first resistor 401, a second resistor 402 serially connected to the first resistor 401, a TLM impedance 403 serially connected to the second resistor 402 and including a first RC circuit and a second RC circuit 404 parallelly connected to the TLM impedance 403 and serially connected to the second resistor 402.

The TLM impedance 403 is an impedance element simulating a transmission line model (TLM). The transmission line model (TLM) is a model simulating the transport of lithium ion existing in an electrode, which is assumed to have pores in the form of a cylindrical shape, through a circuit.

The TLM impedance 403 includes a third resistor 403-1 simulating the resistance when lithium ion is transported into the pores and a capacitor 403-2 simulating the capacitance by an electric double-layer capacitor generated on the pore surface. Specifically, the third resistor 403-1 and the capacitor 403-2 are parallelly connected with each other. Alternatively, the TLM impedance 403 may include a plurality of RC circuits and the plurality of RC circuit may be connected serially or parallelly with each other.

In the circuit model 400 of the electrode assembly 10, the first resistor 401 and the second resistor 402 are serially connected with each other through a first node n1. One end of the second resistor 402 is connected to the first node n1 and the other end is connected a second node n2. One end of the TLM impedance 403 is connected to the second node n2 and the other end is connected a third node n3. One end of the second RC circuit 404 is connected to the second node n2 and the other end is connected the third node n3.

In the circuit model 400 of the electrode assembly 10, the first resistor 401 simulates the ohmic resistance of the electrode assembly 10. The second resistor 402 simulates the interfacial resistance between the active material layer and the current collector of the electrode. The third resistor 403-1 included in the TLM impedance 403 simulates the resistance when lithium ion is transported into the pores and the capacitor 403-2 included in the TLM impedance 403 simulates the capacitance by the electric double-layer capacitor generated on the pore surface. A fourth resistor 404-1 and a capacitor 404-2 included in the second RC circuit 404 simulate the charge transfer resistance acting on the lithium ion during an oxidation/reduction reaction of lithium ion and an electron in the active material layer of the electrode and the capacitance by the electric double-layer capacitor generated in the active material layer irrespectively of the oxidation/reduction reaction, respectively.

Meanwhile, the circuit model 400 of the electrode assembly 10 may further include a capacitor 405. One end of the capacitor 405 is connected to the first node n1 and the other end is connected to the third node n3. The capacitor 405 simulates the capacitance by the electric double-layer capacitor generated from a reaction with an electrolyte solution on the surface of the active material layer.

A total of three capacitors are shown in FIG. 4. For convenience of description, the capacitor 404-2 is referred to as a first capacitor, the capacitor 405 is referred to as a second capacitor and the capacitor 403-2 is referred to as a third capacitor, respectively, hereinafter.

Meanwhile, the circuit model 400 may further include an inductor 406 for improvement in the accuracy of the circuit model 400. The inductor 406 may be serially connected to the first resistor 401. The inductor 406 simulates the induced current generated when an alternating current flows through the electrode assembly 10. Because the inductance value of the inductor 406 is very small in general, the inductor 406 may be omitted from the circuit model 400.

Referring again to FIG. 2, the equation determination unit 120 determines the impedance equation for the circuit model 400 of the electrode assembly 10. The impedance equation may be derived from the known circuit theory using the characteristic values of the circuit elements included in the circuit model 400 of the electrode assembly 10.

Specifically, the impedance equation for the circuit model 400 shown in FIG. 4 may include the inductance value of the inductor 406, the resistance values of the first to fourth resistors 401, 402, 403-1, 404-1, the capacitance values of the first and second capacitors 404-2, 405, the time constant of the first RC circuit and the calibration constants of the first to third capacitors 404-2, 405 and 403-2, etc. as fitting parameters and may include frequency as an input parameter;

Specifically, the equation determination unit 120 may determine an impedance equation expressed by Equation 1.

$$Z(f) = Z_L + Z_{R_1} + \frac{1}{\left(\frac{1}{Z_{R_2}} + \frac{1}{Z_{Q_2}}\right)} + \frac{1}{\left(\frac{1}{Z_{R_1}} + \frac{1}{Z_{Q_1}} + \frac{1}{Z_{TLM}}\right)} \quad [\text{Equation 1}]$$

$$\left( Z_L = i \cdot 2\pi f L,\ Z_{R_1} = R_1 Z_{R_2} = R_2, \right.$$

$$Z_{Q_2} = \frac{1}{(i \cdot 2\pi f)^{a_2} C_2},\ Z_{R_4} = R_4,$$

$$\left. Z_{Q_1} = \frac{1}{(i \cdot 2\pi f)^{a_1} C_1},\ Z_{TLM} = R_3 \frac{\coth(i \cdot 2\pi f \tau)^{\alpha/2}}{(i \cdot 2\pi f \tau)^{\alpha/2}} \right)$$

In Equation 1, Z(f) is the impedance value of the entire circuit model, i is the imaginary unit, f is the frequency, L is the inductance value of the inductor 406, $R_1$ is the resistance value of the first resistor 401, $R_2$ is the resistance value of the second resistor 402, $R_3$ is the resistance value of the third resistor 403-1 included in the first RC circuit of the TLM impedance 403, $R_4$ is the resistance value of the fourth resistor 404-1 included in the second RC circuit 404, $C_1$ is the capacitance value of the first capacitor 404-2 included in the second RC circuit 404, $C_2$ is the capacitance value of the second capacitor 405, $a_1$ is a calibration constant for the first capacitor 404-2, $a_2$ is a calibration constant for the second capacitor 405, $\tau$ is the time constant of the first RC circuit and $\alpha$ is a calibration constant for the third capacitor 403-2.

In the impedance equation, the calibration constants $a_1$, $a_2$, $\alpha$ for the first to third capacitors 404-2, 405, 403-2 are for calibration of the impedance equation because it is impossible to achieve perfect capacitors through which current cannot flow.

The first calculation unit 130 performs fitting through numerical analysis of the fitting parameters included in the impedance equation, i.e., the characteristic values of the circuit elements, such that the difference between the impedance calculation data for different frequencies calculated by changing the frequency which is the input parameter, in the impedance equation (Equation 1) (so as to correspond to the frequency condition of the alternating current signal applied to the electrode assembly) and the impedance measurement data for different frequencies actually acquired from the impedance measurement device 20 is minimized. The characteristic values of the circuit elements mean the characteristic values of the respective circuit elements included in the circuit model 400 of the electrode assembly 10. That is to say, the first calculation unit 130 determines the fitting parameters included in the impedance equation, particularly the inductance value of the inductor 406, the resistance values of the first resistor 401, the second resistor 402, the third resistor 403-1 and the fourth resistor 404-1, the time constant of the first RC circuit, the capacitance values of the first and second capacitors 404-2, 405, the calibration constants for the first to third capacitors 404-2, 405, 403-2, etc., through impedance fitting.

Specifically, the present disclosure uses, from among the resistance values determined through the fitting, the resistance value of the second resistor 402 and the resistance value of the third resistor 403-1 for evaluation of the electrode performance.

The resistance value of the second resistor 402 quantitatively simulates the contact resistance across the interface between the active material layer and the current collector of the electrode. The resistance value of the second resistor 402 may vary depending on the kinds of the active material layer and the electrode of the electrode assembly 10 and the content of the conductive material. For example, the smaller the resistance value of the second resistor 402, the smaller is the contact resistance. In this case, a secondary battery including the electrode exhibits low resistance, high output and fast charge because of efficient electron transport through the interface. Accordingly, the performance of the secondary battery is improved.

The resistance value of the third resistor 403-1 quantitatively simulates the magnitude of the diffusion resistance acting on lithium ion during diffusion of the lithium ion in the electrode to the current collector through the pores of the active material layer. Accordingly, the resistance value of the third resistor 403-1 may be used as a factor for evaluating the performance of the electrode. The resistance value of the third resistor 403-1 may vary depending on the pore structure of the active material layer, the kind of the active material layer, the metal of the current collector, the contents of the conductive material or a binder, etc.

The impedance fitting may be performed by a numerical analysis technique known in the art. That is to say, the plurality of the fitting parameters included in the impedance equation may be optimized by changing the fitting parameters such that the difference between the impedance calculation data for different frequencies and the impedance measurement data for different frequencies is minimized. Specifically, the impedance fitting may be performed using the EC-Lab program of Bio-Logic.

After determining the characteristic values of the circuit elements included in the impedance equation through fitting, the first calculation unit 130 may output some of the values, particularly the resistance value of the third resistor 403-1 included in the TLM impedance 403, to the third calculation unit 150.

The second calculation unit 140 calculates the resistance value of the ion bulk resistance in the electrolyte solution using the ion conductivity of the electrolyte solution, the area of the electrode and the thickness and the porosity of the active material layer.

Here, the ion bulk resistance means the resistance when lithium ion is transported through the electrolyte solution assuming that only the electrolyte solution exists in the path of the lithium ion to the current collector through the pores of the active material layer. For example, in order to assume the nonexistence of interruption to the lithium ion by the active material, conductive material, binder, etc., the ion bulk resistance is quantitatively simulated using the thickness of the active material layer in consideration of only the area corresponding to the porosity from the area of the electrode. That is to say, the ion bulk resistance is the resistance when the lithium ion passes through an electrolyte solution region which is a region assumed to be filled only with the electrolyte solution by the thickness of the active material layer in the (partial) area corresponding to the porosity from the area of the electrode.

After calculating the resistance value of the ion bulk resistance, the second calculation unit 140 outputs the result indicating the resistance value of the ion bulk resistance to the third calculation unit 150. For example, the second calculation unit 140 may calculate the resistance value of the ion bulk resistance using Equation 2.

$$R_{Li\_bulk} = \frac{1}{k} \cdot \frac{L}{A} \qquad \text{[Equation 2]}$$

In Equation 2, $R_{Li\_bulk}$ is the ion bulk resistance, k is the ion conductivity of the electrolyte solution, L is the thickness of the active material layer of the electrode and A is the area of the electrode multiplied by the porosity of the active material layer of the electrode.

The third calculation unit 150 receives the resistance value of the third resistor 403-1 included in the TLM impedance 403 from the first calculation unit 130 as an input and receives the resistance value of the ion bulk resistance from the second calculation unit 140 as an input. Then, the third calculation unit 150 calculates effective tortuosity which is a ratio of the resistance value of the third resistor 403-1 to the resistance value of the ion bulk resistance (calculated from Equation 2).

The effective tortuosity is an indirect measure quantifying the degree of tortuosity of the path of lithium ion with respect to the shortest path during the transport of the lithium ion through the electrode assembly 10 and the number and width of the paths of the lithium ion.

That is to say, the effective tortuosity increases as the path of the lithium ion is more tortuous from the shortest path, as the number of the paths through which the lithium inn is transported is smaller and as the width of the path is narrower.

The third calculation unit 150 quantitatively calculates the effective tortuosity using Equation 3.

$$T_e = \frac{R_3}{R_{Li\_bulk}} \qquad \text{[Equation 3]}$$

In Equation 3, $R_3$ is the resistance value of the third resistor, $R_{Li\_bulk}$ is the resistance value of the ion bulk resistance and $T_e$ is the effective tortuosity.

In the present disclosure, the effective tortuosity is used as an important indicator of the performance of the electrode. That is to say, the smaller the effective tortuosity, the more efficient is the transport of the lithium ion. It is because, the transport path of the lithium ion is less tortuous from the shortest path, the number of the paths is larger or the width of the path is broader. The smaller the effective tortuosity, the resistance of the electrode is smaller, the battery output is higher and the battery charge is faster. Therefore, the battery performance is improved.

Meanwhile, the electrode performance evaluation device according to an exemplary embodiment of the present disclosure may further include a determination unit 160. The determination unit 160 generates a performance evaluation result for the electrode of the electrode assembly 10 by comparing the effective tortuosity with a preset reference value. For this, the third calculation unit 150 outputs the effective tortuosity to the determination unit 160. Then, after receiving the effective tortuosity for the electrode assembly 10 from the third calculation unit 150, the determination unit 160 may output information about the defectiveness of the electrode through an external display (not shown) after comparing the effective tortuosity with the preset reference value. That is to say, the determination unit 160 may determine the electrode performance to be defective if the effective tortuosity is larger than the reference value and may determine the electrode performance to be superior if the effective tortuosity is equal to or smaller than the reference value. The performance evaluation result for the electrode based on the effective tortuosity may be outputted through the display in the form of text, number, image, etc.

In addition, the determination unit 160 may receive the resistance value of the second resistor 402 from the first calculation unit 130 and then generate a performance evaluation result for the electrode by comparing the resistance value of the second resistor 402 with a preset reference value. The second resistor 402 quantitatively simulates the contact resistance across the interface between the active material layer and the current collector of the electrode. Accordingly, the larger the resistance value of the second resistor 402, the larger is the contact resistance of the active material layer and the current collector because the resistance across the interface between the active material layer and the current collector is larger. Therefore, if the resistance value of the second resistor 402 is larger than the reference value set for the second resistor 402, it may be determined that the contact resistance characteristic is defective. On the contrary, if the resistance value of the second resistor 402 is smaller than the reference value, it may be determined that the contact resistance characteristic is superior. In addition, the determination unit 160 may output the performance evaluation result for the electrode based on the resistance value of the second resistor 402 for the electrode assembly to the external display (not shown). For example, the performance evaluation result for the electrode based on the resistance value of the second resistor 402 may be outputted through the display in the form of text, number, image, etc.

Figure 3:
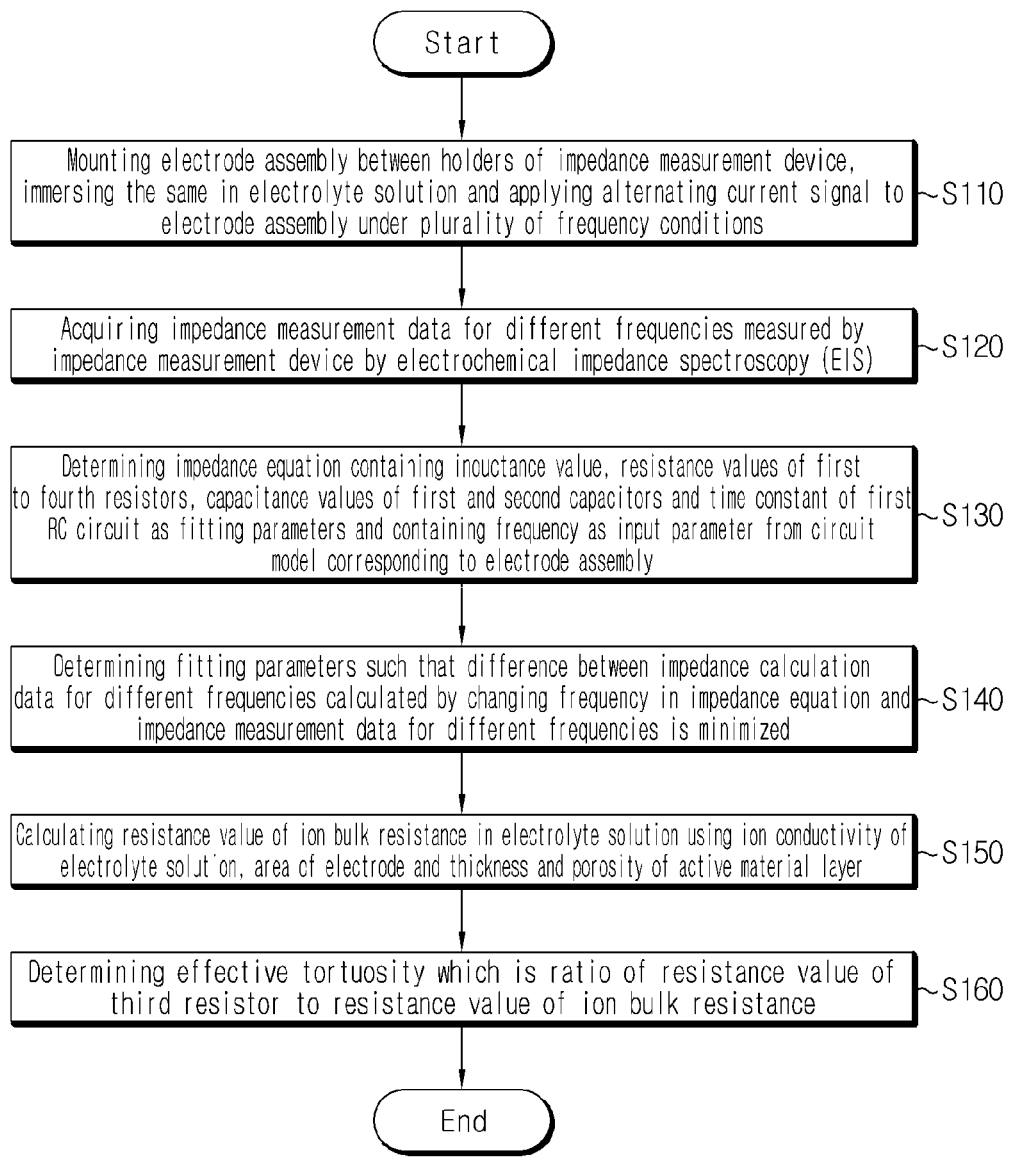
FIG. 3 shows the flow diagram of an electrode performance evaluation method of the electrode performance evaluation system according to FIG. 2.

FIG. 3 shows the flow diagram of an electrode performance evaluation method of the electrode performance evaluation device according to FIG. 2.

Referring to FIG. 1 to FIG. 3, in the electrode performance evaluation method according to an exemplary embodiment of the present disclosure, the electrode assembly 10 which is an object the performance of which is to be evaluated is mounted between the holders 14 and then immersed in a container holding an electrolyte solution (S110). Then, the impedance measurement data for different frequencies are generated by measuring the alternating voltage signal through the holders 14 while applying an alternating current signal to the electrode assembly 10 under a plurality of frequency conditions using the impedance measurement device 20, and input to an input/output interface of the electrode performance evaluation device 100 through an communication cable (S110).

Subsequently, the impedance acquisition unit 110 of the electrode performance evaluation device 100 acquires the impedance measurement data for different frequencies measured for the electrode assembly 10 mounted between the holders 14 through an input/output interface (S120). And, the impedance acquisition unit 110 stores the impedance measurement data for different frequencies acquired from the impedance measurement device 20 in a memory and outputs the impedance measurement data for different frequencies to the first calculation unit 130.

Next, the equation determination unit 120 determines the impedance equation using a preset circuit model corresponding to the electrode assembly 10 (S130). The circuit model 400 according to a specific exemplary embodiment was described above referring to FIG. 4. More specifically, the equation determination unit 120 may determine the impedance equation expressed by Equation 1.

Next, the first calculation unit 130 fits the fitting parameters included in the impedance equation, i.e., the characteristic values of the circuit elements, such that the difference between the impedance calculation data for different frequencies calculated mathematically from the impedance equation and the impedance measurement data for different frequencies received from the impedance acquisition unit 110 is minimized (S140). During this procedure, the characteristic values of the circuit elements included in the impedance equation expressed by Equation 1, i.e., the inductance value of the inductor 406, the resistance values of the first to fourth resistors 401, 402, 403-1, 404-1, the time constant of the first RC circuit, the capacitance values of the first and second capacitors 404-2, 405, the calibration constants for the first to third capacitors 404-2, 405, 403-2, etc., are determined. The first calculation unit 130 outputs the resistance value of the third resistor 403-1 included in the TLM impedance 403 to the third calculation unit 150.

Next, the second calculation unit 140 calculates the resistance value of the ion bulk resistance in the electrolyte solution from Equation 2 using the ion conductivity of the electrolyte solution, the area of the electrode and the thickness and porosity of the active material layer (S150). In addition, the second calculation unit 140 outputs the resistance value of the ion bulk resistance to the third calculation unit 150.

Next, the third calculation unit 150 calculates effective tortuosity by calculating the ratio of the resistance value of the third resistor received from the first calculation unit 130 to the resistance value of the ion bulk resistance received from the second calculation unit 140 according to Equation 3 (S160).

Meanwhile, the electrode performance evaluation method according to an exemplary embodiment of the present disclosure may further include, after the step S160, a step of evaluating the electrode performance using the effective tortuosity and the resistance value of the second resistor 402.

That is to say, the determination unit 160 may generate the performance evaluation result for the electrode of the electrode assembly 10 by receiving the effective tortuosity from the third calculation unit 150 and comparing the effective tortuosity with a preset reference value. In addition, the determination unit 160 may output the generated performance evaluation result through an external display (not shown). For example, if the effective tortuosity is larger than the reference value, an information representing that the diffusion performance of lithium ion through the active material layer of the electrode is defective may be displayed in the form of text, number, image, etc. On the contrary, if the effective tortuosity is equal to or smaller than the reference value, an information representing that the diffusion performance of lithium ion through the active material layer of the electrode is superior may be displayed in the form of text, number, image, etc.

In addition, the determination unit 160 may generate the performance evaluation result for the electrode by receiving the resistance value of the second resistor 402 from the first calculation unit 130 and comparing the resistance value of the second resistor 402 with a preset reference value. In addition, the determination unit 160 may output the generated performance evaluation result through an external display. For example, if the resistance value of the second resistor 402 is larger than the reference value, an information representing that the contact resistance characteristic of the active material layer and the current collector is defective may be displayed in the form of text, number, image, etc. On the contrary, if the resistance value of the second resistor 402 is equal to or smaller than the reference value, an information representing that the contact resistance characteristic of the active material layer and the current collector is superior may be displayed in the form of text, number, image, etc.

The present disclosure is applicable to any electrochemical device including an electrode having conductivity and porosity. For example, the present disclosure can be applied to secondary batteries, supercapacitors, storage batteries, fuel cells, etc.

In a specific exemplary embodiment of the present disclosure, the secondary battery may be a lithium-ion secondary battery, a lithium polymer secondary battery, a lithium-metal secondary battery or a lithium-ion polymer secondary battery.

In the present disclosure, the electrode refers to a positive electrode or a negative electrode and may be prepared by binding an electrode active material onto an electrode current according to a method known in the art.

Non-limiting examples of the positive electrode active material include the common positive electrode active materials that may be used in the positive electrodes of the existing electrochemical devices. Specifically, lithium manganese oxide, lithium cobalt oxide, lithium nickel oxide, lithium iron oxide or lithium composite oxide as a combination thereof may be used. Non-limiting examples of the negative electrode active material include the common negative electrode active materials that may be used in the negative electrodes of the existing electrochemical devices. Specifically, lithium metal, lithium alloy or lithium intercalation material such as carbon, petroleum coke, activated carbon, graphite, etc. may be used. Non-limiting examples of the positive electrode current collector include foils prepared from aluminum, nickel or a combination thereof and non-limiting examples of the negative electrode current collector include foils prepared from copper, gold, nickel, copper alloy or a combination thereof.

The separator 13 may be any insulating membrane that electrically insulates the negative electrode from the positive electrode without limitation. In an exemplary embodiment of the present disclosure, the separator 13 is disposed between the positive electrode and the negative electrode and an insulating thin film having high ion permeability and mechanical strength is used. In general, the separator 13 has a pore diameter of 0.01-10 μm and a thickness of 5-300 μm. As the separator 13, a sheet, a non-woven fabric, etc. prepared from an olefin-based polymer with chemical resistance and hydrophobicity, such as polyethylene, polypropylene, etc., glass fiber, etc. is used, for example. According to circumstances, an inorganic coating layer including inorganic particles may be further formed on the outermost surface of the separator 13 to improve the thermal stability of the separator 13. The separator 13 may be a solid electrolyte.

The electrolyte solution that may be used in the electrochemical device of the present disclosure may be a salt in the form of $A^+B^-$; wherein $A^+$ is an alkali metal cation such as $Li^+$, $Na^+$, $K^+$ or a combination thereof and $B^-$ is an anion such as $PF_6^-$, $BF_4^-$, $Cl^-$, $Br^-$, $I^-$, $ClO_4^-$, $AsF_6^-$, $CH_3CO_2^-$, $CF_3SO_3^-$, $N(CF_3SO_2)_2^-$, $C(CF_2SO_2)_3^-$ or a combination thereof, dissolved or dissociated in an organic solvent selected from propylene carbonate (PC), ethylene carbonate (EC), diethyl carbonate (DEC), dimethyl carbonate (DMC), dipropyl carbonate (DPC), dimethyl sulfoxide, acetonitrile, dimethoxyethane, diethoxyethane, tetrahydrofuran, N-methyl-2-pyrrolidone (NMP), ethyl methyl carbonate (EMC), γ-butyrolactone(gamma-butyrolactone) or a mixture thereof, although not being limited thereto.

The holder 14 of the impedance measurement device 20 of the present disclosure may be made of any material which is not corroded in an electrolyte solution without limitation. And, as the reference electrode of the impedance measurement device 20 of the present disclosure, any electrode capable of maintaining a constant voltage may be used.

EXAMPLES

Hereinafter, the evaluation of electrode performance of the electrode assembly 10 using the electrode performance evaluation system and the electrode performance evaluation method according to the present disclosure is described in detail through examples. However, the examples are merely exemplary embodiments of the present disclosure and the scope of the present disclosure is not limited by them.

Example 1

In Example 1, a negative electrode slurry was prepared by mixing a negative electrode active material (graphite), a conductive material (carbon black) and a binder (SBR) in deionized water at a weight ratio of 95.5:1:3.5 and a negative electrode was prepared by coating the negative electrode slurry on a 20-μm thick copper foil as a negative electrode current collector to have a capacity of 4.0 mAh/cm² and then drying and compressing the same. The negative electrode slurry was dried at 40° C. for 12 hours. A separator (porous polyethylene, thickness: 20 μm) was interposed between two sheets of the negative electrode and mounted between a pair of holders. Then, the electrode assembly mounted between the holders was immersed in a container holding an electrolyte solution.

The electrolyte solution was prepared by adding $LiPF_6$ to a 70:30 (volume ratio) organic solvent of ethylene carbonate (EC) and ethyl methyl carbonate (EMC) to a concentration of 1 M.

Then, the performance of the electrode assembly was evaluated using the electrode performance evaluation system and the electrode performance evaluation method according to the present disclosure.

The frequency of the alternating current signal applied to the electrode assembly by the impedance measurement device was changed by 100 or more points in a range from 500 kHz to 0.1 Hz. The magnitude (amplitude) of the alternating voltage was controlled to 100 mV and the temperature of the container holding the electrolyte solution was maintained at 25° C.

The active material layer coated on the current collector had a porosity of 30%. The area of the electrode was 1.5 cm² and the lithium ion conductivity in the electrolyte solution was measured to be 9 mS/cm. The porosity of the active material layer was calculated from Equation 4 using the density ($d_{calculated}$) of the active material layer including the negative electrode active material (graphite), the conductive material (carbon black) and the binder (SBR) and the density ($d_{electrode}$) determined from the weight and thickness of the actually coated active material layer. The lithium ion conductivity in the electrolyte solution was measured using a conductivity meter.

$$\text{Porosity} = \left(1 - \frac{d_{electrode}}{d_{calculated}}\right) \times 100\% \qquad \text{[Equation 4]}$$

Example 2

After preparing an electrode assembly in the same manner as in Example 1, except that the negative electrode slurry was dried at 80° C. for 12 hours, the performance of the electrode assembly was evaluated.

The active material layer coated on the current collector had a porosity of 30%. The area of the electrode was 1.5 cm$^2$ and the lithium ion conductivity in the electrolyte solution was measured to be 9 mS/cm. The porosity of the active material layer was calculated from Equation 4 using the density ($d_{calculated}$) of the active material layer including the negative electrode active material (graphite), the conductive material (carbon black) and the binder (SBR) and the density ($d_{electrode}$) determined from the weight and thickness of the actually coated active material layer. The lithium ion conductivity in the electrolyte solution was measured using a conductivity meter.

Example 3

After preparing an electrode assembly in the same manner as in Example 1, except that the negative electrode slurry was dried at 120° C. for 12 hours, the performance of the electrode assembly was evaluated.

The active material layer coated on the current collector had a porosity of 30%. The area of the electrode was 1.5 cm$^2$ and the lithium ion conductivity in the electrolyte solution was measured to be 9 mS/cm. The porosity of the active material layer was calculated from Equation 4 using the density ($d_{calculated}$) of the active material layer including the negative electrode active material (graphite), the conductive material (carbon black) and the binder (SBR) and the density ($d_{electrode}$) determined from the weight and thickness of the actually coated active material layer. The lithium ion conductivity in the electrolyte solution was measured using a conductivity meter.

FIG. 5 shows a result of plotting the impedance measurement data for different frequencies acquired for the electrode assemblies prepared in Examples 1-3.

The electrode assemblies of Examples 1-3 have different binder topology in the active material layer, i.e., the spatial structure between the active materials bound by the binder, although the area, thickness and the active material layer of the electrode are identical, because the slurry coating process (active material layer drying temperature) was controlled differently during the preparation of the negative electrode. Because the electrode assemblies of Examples 1-3 have different binder topologies, they show different resistance values of the third resistor, which is a fitting parameter for the electrode assemblies according to Examples 1-3, and effective tortuosity calculated therefrom, as shown in Table 1. Accordingly, it can be seen that the effective tortuosity can be an effective parameter for evaluating electrode performance.

That is to say, by evaluating the performance of batteries fabricated using electrodes with different effective tortuosity and empirically/experimentally elucidating the relationship between the effective tortuosity and the performance, the reference value of the effective tortuosity may be set based on the result. Then, an electrode whose effective tortuosity is smaller than the reference value may be evaluated as an electrode having superior lithium ion transport performance. On the contrary, an electrode whose effective tortuosity is larger than the reference value may be evaluated as an electrode having defective lithium ion transport performance.

As a result of measuring the effective tortuosity for Examples 1-3, the electrode of Example 1 showed good lithium ion transport performance. If the reference value for the effective tortuosity was set to 7.5, the electrode of Example 1 may be evaluated as superior and the electrodes of Examples 2 and 3 may be evaluated as defective.

TABLE 1

|  | Example 1 | Example 2 | Example 3 |
| --- | --- | --- | --- |
| Resistance of third resistor | 1.82 | 1.92 | 2.07 |
| Ion bulk resistance | 0.25 | 0.25 | 0.25 |
| Effective tortuosity | 7.28 | 7.68 | 8.28 |

Example 4

A positive electrode slurry was prepared by mixing a positive electrode active material (LiNiCoMnO$_2$), a conductive material (carbon black) and a binder (PVDF) in N-methyl-2-pyrrolidone (NMP) at a weight ratio of 96.7:2:1.3 and a positive electrode was prepared by coating the positive electrode slurry on a 20-μm thick aluminum foil as a positive electrode current collector to have a capacity of 2.5 mAh/cm$^2$ and then drying and compressing the same. A separator (porous polyethylene, thickness: 20 μm) was interposed between two sheets of the positive electrode and mounted between a pair of holders. Then, the electrode assembly mounted between the holders was immersed in a container holding an electrolyte solution.

The electrolyte solution was prepared by adding LiPF$_6$ to a 70:30 (volume ratio) organic solvent of ethylene carbonate (EC) and ethyl methyl carbonate (EMC) to a concentration of 1 M.

Then, the performance of the electrode assembly was evaluated using the electrode performance evaluation system and the electrode performance evaluation method according to the present disclosure.

The frequency of the alternating current signal applied to the electrode assembly by the impedance measurement device was changed by 100 or more points in a range from 500 kHz to 0.1 Hz. The magnitude (amplitude) of the alternating voltage was controlled to 100 mV and the temperature of the container holding the electrolyte solution was maintained at 25° C.

Example 5

After preparing an electrode assembly in the same manner as in Example 4, except that the composition of the positive electrode active material, the conductive material and the binder constituting the positive electrode slurry was changed to 95:3:2 (weight ratio), the performance of the electrode assembly was evaluated.

Example 6

After preparing an electrode assembly in the same manner as in Example 4, except that the composition of the positive electrode active material, the conductive material and the binder constituting the positive electrode slurry was changed to 93.3:4:2.7 (weight ratio), the performance of the electrode assembly was evaluated.

Figure 7:
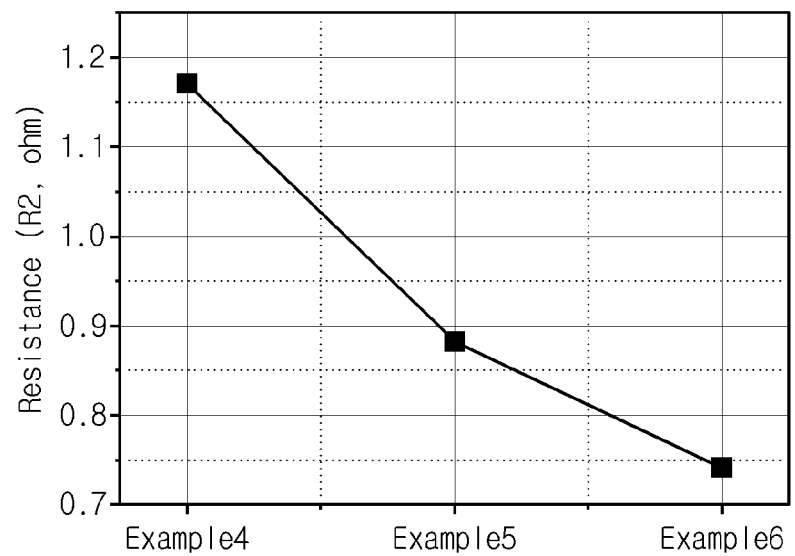
FIG. 7 shows a result of plotting the resistance value of the second resistor included in the circuit models corresponding to the electrode assemblies prepared in Examples 4-6.

FIG. 6 shows a result of plotting the impedance measurement data for different frequencies acquired for the electrode assemblies prepared in Examples 4-6. And, FIG. 7 shows a result of plotting the resistance value of the second resistor included in the circuit models corresponding to the electrode assemblies prepared in Examples 4-6.

The electrode assemblies of Examples 4-6 have different composition of the positive electrode active material, the conductive material and the binder in the positive electrode slurry although the area, thickness and the active material layer of the electrode are identical. As a result, the resistance values of the third resistor and the second resistor were fitted differently when the impedance fitting method according to the present disclosure was applied, as shown in Table 2.

Accordingly, by evaluating the performance of batteries fabricated using electrodes with different resistance values of the second resistor and the third resistor and empirically/experimentally elucidating the relationship between the resistance values of the second resistor and the third resistor and the electrode performance, the reference values of the resistance values of the second resistor and the third resistor may be set based on the result. Then, the electrode performance may be evaluated by comparing the resistance values of the second resistor and the third resistor fitted according to the present disclosure with the reference values.

TABLE 2

|  | Example 4 | Example 5 | Example 6 |
|---|---|---|---|
| Conductive material content | 2 wt % | 3 wt % | 4 wt % |
| Resistance of third resistor | 4.00 | 6.17 | 7.44 |
| Resistance of second resistor | 1.17 | 0.88 | 0.74 |

For Example 4, the lithium ion transport performance in the active material layer is good because the resistance value of the third resistor is the lowest, but the contact resistance characteristic between the active material layer and the current collector is evaluated to be lower as compared to the other examples because resistance value of the second resistor is the highest. If the reference value for the second resistor is set to 1.00, the electrodes of Example 5 and Example 6 may be evaluated to have superior contact resistance characteristics between the active material layer and the current collector.

In the exemplary embodiments described above, the impedance acquisition unit 110, the first calculation unit 130, the second calculation unit 140, the third calculation unit 150 and the determination unit 160 included in the electrode performance evaluation device 100 may be written by a computer program, may be recorded in a computer-readable medium and may be executed by a microprocessor. The functional programs, codes and code segments for embodying the present disclosure may be easily deducted by programmers in the art to which the present disclosure belongs. The computer-readable medium includes any type of recording medium in which data that can be read by a computer system is stored. Examples of the computer-readable medium include ROM, RAM, CD-ROM, magnetic tape, floppy disk, optical data storage, etc.

The electrode performance evaluation device 100 may be embodied as a commercialized computer apparatus. The computer program including the impedance acquisition unit 110, the first calculation unit 130, the second calculation unit 140, the third calculation unit 150 and the determination unit 160 may be stored executably in a recording medium (e.g., hard disk) of the computer apparatus and may be executed upon request of an operator. The computer apparatus may be connected to the impedance measurement device 20 via a communications cable through an input/output (I/O) interface so as to receive the impedance measurement data for different frequencies from the impedance measurement device 20.

In the description of the various exemplary embodiments of the present disclosure, it should be understood that the element referred to as 'unit' is distinguished functionally rather than physically. Therefore, each element may be selectively integrated with other elements or each element may be divided into sub-elements for effective implementation control logic(s). However, it is obvious to those skilled in the art that, if functional identity can be acknowledged for the integrated or divided elements, the integrated or divided elements fall within the scope of the present disclosure.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

DESCRIPTION OF REFERENCE NUMERALS

1: electrolyte solution
10: electrode assembly
11: first electrode
11-1: first active material layer
11-2: first current collector
12: second electrode
12-1: second active material layer
12-2: second current collector
13: separator
14: holders
20: impedance measurement device
100: electrode performance evaluation device
110: impedance acquisition unit
120: equation determination unit
130: first calculation unit
140: a second calculation unit
150: a third calculation unit
160: determination unit
400: circuit model
401: first resistor
402: second resistor
403: TLM impedance
403-1: third resistor
403-2: third capacitor
404: RC circuit
404-1: fourth resistor
404-2: first capacitor
405: second capacitor
406: inductor

What is claimed is:

1. An electrode performance evaluation method, comprising:
   (a) mounting an electrode assembly, which comprises an electrode wherein an active material layer is coated on a current collector, between holders of an impedance measurement device, immersing the electrode assembly in an electrolyte solution and applying an alternating current signal to the electrode assembly under a plurality of frequency conditions;
   (b) acquiring impedance measurement data for different frequencies measured by the impedance measurement device by electrochemical impedance spectroscopy while the alternating current signal is applied to the electrode assembly from the impedance measurement device;

(c) determining, from a circuit model comprising an inductor, a first resistor serially connected to the inductor, a second resistor serially connected to the first resistor, a transmission line model (TLM) impedance serially connected to the second resistor and comprising a first resistor-capacitor (RC) circuit wherein a third resistor and a third capacitor are connected in parallel, a second RC circuit parallelly connected to the TLM impedance, wherein a fourth resistor and a first capacitor are connected in parallel, and a second capacitor parallelly connected to the second resistor and the TLM impedance, as a circuit model corresponding to the electrode assembly, an impedance equation comprising the inductance value of the inductor, the resistance values of the first to fourth resistors, the capacitance values of the first and second capacitors and the time constant of the first RC circuit as fitting parameters and comprising frequency as an input parameter;

(d) determining the fitting parameters comprising the resistance values of the first to third resistors and the time constant of the first RC circuit such that the difference between impedance calculation data for different frequencies calculated by changing the frequency in the impedance equation and the impedance measurement data for different frequencies is minimized;

(e) calculating the resistance value of ion bulk resistance in the electrolyte solution using the ion conductivity of the electrolyte solution, the area of the electrode and the thickness and porosity of the active material layer of the electrode;

(f) determining effective tortuosity which is a ratio of the resistance value of the third resistor to the resistance value of the ion bulk resistance; and (g) generating a performance evaluation result for the electrode and identifying the electrode as a defective electrode if the electrode fails to meet predetermined criteria.

2. The electrode performance evaluation method according to claim 1, wherein the impedance equation determined in (c) is expressed by Equation 1:

$$Z(f) = Z_L + Z_{R_1} + \frac{1}{\left(\frac{1}{Z_{R_2}} + \frac{1}{Z_{Q_2}}\right)} + \frac{1}{\left(\frac{1}{Z_{R_1}} + \frac{1}{Z_{Q_1}} + \frac{1}{Z_{TLM}}\right)} \quad \text{[Equation 1]}$$

$$\left(Z_L = i \cdot 2\pi f L, Z_{R_1} = R_1 Z_{R_2} = R_2,\right.$$

$$Z_{Q_2} = \frac{1}{(i \cdot 2\pi f)^{a_2} C_2}, Z_{R_4} = R_4,$$

$$\left.Z_{Q_1} = \frac{1}{(i \cdot 2\pi f)^{a_1} C_1}, Z_{TLM} = R_3 \frac{\coth(i \cdot 2\pi f \tau)^{\alpha/2}}{(i \cdot 2\pi f \tau)^{\alpha/2}}\right)$$

wherein Z(f) is the impedance of the electrode assembly, i is the imaginary unit, f is the frequency, L is the inductance value of the inductor, $R_1$ is the resistance value of the first resistor, $R_2$ is the resistance value of the second resistor, $R_3$ is the resistance value of the third resistor, $R_4$ is the resistance value of the fourth resistor, $C_1$ is the capacitance value of the first capacitor, $C_2$ is the capacitance value of the second capacitor, $a_1$ is a calibration constant for the first capacitor, $a_2$ is a calibration constant for the second capacitor, $\tau$ is the time constant of the first RC circuit and $\alpha$ is a calibration constant for the third capacitor.

3. The electrode performance evaluation method according to claim 1, wherein, in (e), the resistance value of the ion bulk resistance is calculated using Equation 2:

$$R_{Li\_bulk} = \frac{1}{k} \cdot \frac{L}{A} \quad \text{[Equation 2]}$$

wherein $R_{Li\_bulk}$ is the ion bulk resistance, k is the ion conductivity of the electrolyte solution, L is the thickness of the active material layer of the electrode and A is the area of the electrode multiplied by the porosity of the active material layer of the electrode.

4. The electrode performance evaluation method according to claim 1, which further comprises:

(g1) generating a performance evaluation result for the electrode by comparing the effective tortuosity with a preset reference value and displaying the performance evaluation result through a display.

5. The electrode performance evaluation method according to claim 1, which further comprises:

(g2) generating a performance evaluation result for the electrode by comparing the resistance value of the second resistor with a preset reference value and displaying the performance evaluation result through a display.

6. An electrode performance evaluation method according to claim 1, further comprising:

(h) repeating steps (a)-(g) for a plurality of electrode assemblies.

7. An electrode performance evaluation method according to claim 6, further comprising:

(i) discarding the one or more defective electrodes.

8. An electrode performance evaluation system comprising:

an impedance acquisition unit configured to acquire impedance measurement data for different frequencies measured for an electrode assembly comprising an electrode by electrochemical impedance spectroscopy;

an equation determination unit configured to determine, using a circuit model comprising an inductor, a first resistor serially connected to the inductor, a second resistor serially connected to the first resistor, a transmission line model (TLM) impedance serially connected to the second resistor and comprising a first resistor-capacitor (RC) circuit wherein a third resistor and a third capacitor are connected in parallel, a second RC circuit parallelly connected to the TLM impedance, wherein a fourth resistor and a first capacitor are connected in parallel, and a second capacitor parallelly connected to the second resistor and the TLM impedance, as a circuit model corresponding to the electrode assembly, an impedance equation comprising the inductance value of the inductor, the resistance values of the first to fourth resistors, the capacitance values of the first and second capacitors and the time constant of the first RC circuit as fitting parameters and comprising frequency as an input parameter;

a first calculation unit configured to determine the fitting parameters comprising the resistance values of the first to third resistors and the time constant of the first RC circuit such that the difference between the impedance calculation data for different frequencies calculated by changing the frequency in the impedance equation and the impedance measurement data for different frequencies is minimized;

a second calculation unit configured to calculate the resistance value of ion bulk resistance in the electrolyte solution using the ion conductivity of the electrolyte solution, the area of the electrode and the thickness and porosity of the active material layer of the electrode; and a third calculation unit configured to determine effective tortuosity which is a ratio of the resistance value of the third resistor to the resistance value of the ion bulk resistance.

9. The electrode performance evaluation system according to claim 8, wherein the equation determination unit is configured to determine the impedance equation expressed by Equation 1:

$$Z(f) = Z_L + Z_{R_1} + \frac{1}{\left(\frac{1}{Z_{R_2}} + \frac{1}{Z_{Q_2}}\right)} + \frac{1}{\left(\frac{1}{Z_{R_1}} + \frac{1}{Z_{Q_1}} + \frac{1}{Z_{TLM}}\right)} \quad \text{[Equation 1]}$$

$$\left(Z_L = i \cdot 2\pi f L, \; Z_{R_1} = R_1 Z_{R_2} = R_2,\right.$$

$$Z_{Q_2} = \frac{1}{(i \cdot 2\pi f)^{a_2} C_2}, \; Z_{R_4} = R_4,$$

$$\left. Z_{Q_1} = \frac{1}{(i \cdot 2\pi f)^{a_1} C_1}, \; Z_{TLM} = R_3 \frac{\coth(i \cdot 2\pi f \tau)^{\alpha/2}}{(i \cdot 2\pi f \tau)^{\alpha/2}}\right)$$

wherein Z(f) is the impedance of the electrode assembly, i is the imaginary unit, f is the frequency, L is the inductance value of the inductor, $R_1$ is the resistance value of the first resistor, $R_2$ is the resistance value of the second resistor, $R_3$ is the resistance value of the third resistor, $R_4$ is the resistance value of the fourth resistor, $C_1$ is the capacitance value of the first capacitor, $C_2$ is the capacitance value of the second capacitor, $a_1$ is a calibration constant for the first capacitor, $a_2$ is a calibration constant for the second capacitor, τ is the time constant of the first RC circuit and α is a calibration constant for the third capacitor.

10. The electrode performance evaluation system according to claim 8, wherein the second calculation unit is configured to calculate the resistance value of the ion bulk resistance using Equation 2:

$$R_{Li\_bulk} = \frac{1}{k} \cdot \frac{L}{A} \quad \text{[Equation 2]}$$

wherein $R_{Li\_bulk}$ is the ion bulk resistance, k is the ion conductivity of the electrolyte solution, L is the thickness of the active material layer of the electrode and A is the area of the electrode multiplied by the porosity of the active material layer of the electrode.

11. The electrode performance evaluation system according to claim 8, which further comprises a determination unit configured to generate a performance evaluation result for the electrode by comparing the effective tortuosity with a preset reference value and display the performance evaluation result through a display.

12. The electrode performance evaluation system according to claim 8, which further comprises a determination unit configured to generate a performance evaluation result for the electrode by comparing the resistance value of the second resistor with a preset reference value and display the performance evaluation result through a display.

* * * * *